(12) United States Patent
Liu

(10) Patent No.: US 9,076,902 B2
(45) Date of Patent: Jul. 7, 2015

(54) INTEGRATED OPTICAL RECEIVER ARCHITECTURE FOR HIGH SPEED OPTICAL I/O APPLICATIONS

(71) Applicant: Ansheng Liu, Cupertino, CA (US)

(72) Inventor: Ansheng Liu, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 107 days.

(21) Appl. No.: 13/686,706

(22) Filed: Nov. 27, 2012

(65) Prior Publication Data

US 2013/0328145 A1 Dec. 12, 2013

Related U.S. Application Data

(63) Continuation of application No. 12/651,314, filed on Dec. 31, 2009, now Pat. No. 8,319,237.

(51) Int. Cl.
*H01L 31/0232* (2014.01)
*H01L 31/18* (2006.01)
*G02B 6/02* (2006.01)
*G02B 6/42* (2006.01)

(52) U.S. Cl.
CPC ........ *H01L 31/0232* (2013.01); *G02B 6/02023* (2013.01); *G02B 6/4214* (2013.01); *G02B 6/4215* (2013.01); *H01L 31/1808* (2013.01)

(58) Field of Classification Search
None
See application file for complete search history.

(56) References Cited

U.S. PATENT DOCUMENTS

| | | | |
|---|---|---|---|
| 4,696,536 A | 9/1987 | Albares et al. | |
| 5,054,871 A | 10/1991 | Deri et al. | |
| 5,391,869 A | 2/1995 | Ade et al. | |
| 5,394,490 A | 2/1995 | Kato et al. | |
| 5,835,517 A * | 11/1998 | Jayaraman et al. | 372/50.124 |
| 6,316,281 B1 * | 11/2001 | Lee et al. | 438/31 |
| 6,808,957 B1 * | 10/2004 | Ho et al. | 438/57 |
| 2002/0110328 A1 * | 8/2002 | Bischel et al. | 385/49 |
| 2005/0053319 A1 * | 3/2005 | Doan | 385/14 |
| 2005/0249509 A1 | 11/2005 | Nagarajan et al. | |
| 2007/0002327 A1 | 1/2007 | Zhou et al. | |

FOREIGN PATENT DOCUMENTS

| | | |
|---|---|---|
| JP | 2006053471 | 2/2006 |
| JP | 3991220 | 10/2007 |
| WO | WO 02/073256 | 9/2002 |
| WO | WO-2011081845 | 7/2011 |

OTHER PUBLICATIONS

"PCT/US2010/059852 International PCT Search Report and Written Opinion", Mailed Aug. 31, 2012, 9 pages.

(Continued)

*Primary Examiner* — Tan N Tran
*Assistant Examiner* — Scott R Wilson
(74) *Attorney, Agent, or Firm* — Blakely, Sokoloff, Taylor & Zafman LLP

(57) ABSTRACT

An integrated optical receiver architecture may be used to couple light between a multi-mode fiber (MMF) and silicon chip which includes integration of a silicon de-multiplexer and a high-speed Ge photo-detector. The proposed architecture may be used for both parallel and wavelength division multiplexing (WDM) based optical links with a data rate of 25 Gb/s and beyond.

19 Claims, 3 Drawing Sheets

(56) References Cited

OTHER PUBLICATIONS

Ramaswamy, et al., "A Higher Power Ge n-i-p waveguide photodetector in Silicon-on-insulator Substrate", *2009 6th IEEE International Conference of Group IV Photonics*, Sep. 9-11, 2009, San Francisco, California USA, pp. 19-21.

Sure, Anita, et al., "Fabrication and Characterization of three-dimensional silicon tapers", vol. 11. No. 26./ *Optics Express 3555*.

Electronics Letters, Jun. 23, 2005, vol. 41, No. 13, pp. 766-767 (3 pages).

Anita Sure et al., "Fabrication and characterization of three-dimensional silicon tapers," Opt. Express 11, Dec. 29, 2003, vol. 11, No. 26, Optics Express, pp. 3555-3561.

Extended European Search Report for EP Application No. 10841481.4, 10 pages, Issued Mar. 19, 2015.

\* cited by examiner

INTEGRATED OPTICAL RECEIVER ARCHITECTURE FOR HIGH SPEED OPTICAL I/O APPLICATIONS

This Application is a Continuation of U.S. application Ser. No. 12/651,314, filed Dec. 31, 2009, entitled "Integrated Optical Receiver Architecture for High Speed Optical I/O Applications", now issued as U.S. Pat. No. 8,319,237, and priority is claimed thereof.

FIELD OF THE INVENTION

Embodiments of the present invention are directed to optical receivers and, more particularly, to integrated optical receivers with embedded tapers for improved fiber alignment tolerances.

BACKGROUND INFORMATION

Efficient light coupling between an optical fiber and a silicon waveguide is highly desired for silicon based photonic device and circuit applications. Due to the high refractive index contrast of silicon waveguide systems, obtaining good fiber-silicon waveguide coupling may be challenging.

In optical communication, information is transmitted by way of an optical carrier whose frequency typically is in the visible or near-infrared region of the electromagnetic spectrum. A carrier with such a high frequency is sometimes referred to as an optical signal, an optical carrier, or a lightwave signal. A typical optical communication network includes several optical fibers, each of which may include several channels. A channel is a specified frequency band of an electromagnetic signal, and is sometimes referred to as a wavelength.

Technological advances today include optical communication at the integrated circuit (or chip) level. This is because integrated circuits have size advantages that are attractive in computer systems. Sometimes designers couple an optical signal (light) between two chips, between a chip and a die in the system, or between two dies. This is traditionally accomplished using an optical fiber to couple light between waveguides on dies or chips.

One limitation of using the optical fiber to couple light between waveguides on dies or chips is that this method of coupling tends to be inefficient. One reason is because of the physical size difference between the optical fiber and a typical waveguide on a chip or die. The optical fiber tends to much larger than the waveguide. Because of the size difference the optical signal coupling efficiency is poor. That is, the light from the larger diameter optical fiber does not fit well into the small waveguide. The result can be that received light levels are so low that individual bits in the data stream in the optical signal become indistinguishable. When this happens, the receiving component may not be able to recover the information from the data stream.

Coupling efficiency may be improved by attaching lenses to the optical fiber or by placing a lens between the optical fiber and the waveguide to focus the optical signal into the waveguide. However, coupling efficiency is only fair using lenses. Other coupling methods result in efficiencies that are also fair at best.

This limitation also comes with another challenge such as efficient coupling from the optical mode supported by the larger optical fiber to the smaller optical mode supported by the waveguide. The mode is the optical cross-sectional distribution of energy (Gaussian distribution) and is defined by the size of your waveguide (optical fiber, planar waveguide) and the wavelength of the light. There is a large optical mode in the larger optical fiber and a smaller optical mode in the smaller waveguide.

Also coupling from an optical fiber to small on-die waveguides requires very precise alignment. This is typically accomplished with specialized precise manual alignment procedures. Such specialized alignment procedures typically are very expensive and limit practical volumes.

Today, there is a fundamental problem existing for a low-cost multi-mode fiber (MMF) based optical receiver for high speed applications. To achieve high speed, for example 25 Gb/s and beyond, operation for a photo-detector (PD), the active area of the detector is usually required to be small. However, to efficiently couple light from MMF into a semiconductor waveguide based chip that contains photo-detectors and potentially an optical de-multiplexer, a large waveguide size is used for big misalignment tolerance needed for low cost passive alignment.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Described is an integrated receiver optical receiver architecture to address light coupling between a multi-mode fiber (MMF) and silicon chip as well as integration of silicon de-multiplexer and a high-speed photo-detector. The proposed architecture can be used for both parallel and wavelength division multiplexing (WDM) based optical links with a data rate of 25 Gb/s and beyond.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
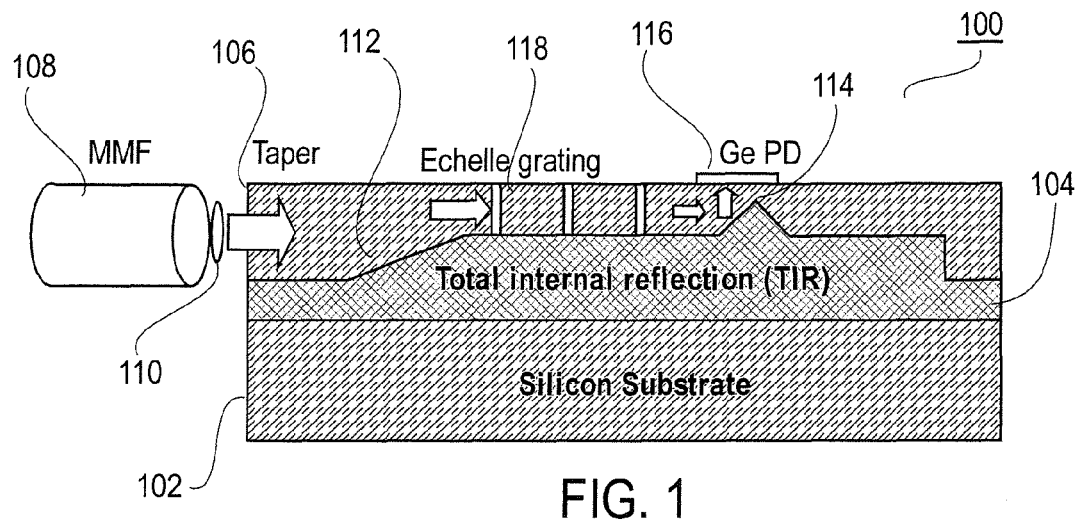
FIG. 1 is a cut-away side view of an integrated optical receiver according to one embodiment of the invention.

Referring now to FIG. 1, there is shown the optical receiver according to one embodiment of the invention. The optical receiver 100 comprises a silicon wafer portion 102 on which a total internal reflection (TIR) mirror structure 104 is situated. A waveguide portion 106 comprises a wide end into which light from a fiber, such as a multi-mode optical fiber 108 may be input. The light may be focused through a lens 110. The waveguide 106 comprises a taper 112 where the waveguide narrows from the bottom. The TIR structure comprises a wedge 114 having a reflective surface to direct the light, traveling parallel to the substrate 102, is reflected upward to a high speed photo-detector 116 as indicated by the arrows. A silicon de-multiplexer 118 may also be optionally fabricated into the waveguide 106 as shown. For example the de-multiplexer may comprise a diffraction grating, such as the etched Echelle grating illustrated. The etched Echelle grating may be capable of de-multiplexing both single-mode and multi-mode beams.

This integrated silicon chip shown in FIG. 1, may be fabricated on a silicon-on-insulator (SOI) substrate. For parallel link applications, the de-multiplexer may not be included. The silicon taper 112 input has a height of 20-30 um at the wide end for efficient coupling between the MMF 108 and the chip with a plastic lens 110. The final waveguide 106 height after the taper is ~10 um. The taper may be fabricated, for example by using a grayscale technology as described in Optics Express vol. 11, no. 26, 3555-3561 (2003), herein incorporated by reference.

Note that the final waveguide size should probably not be small because of the possible modal filtering effect (optical loss) for a multi mode beam launched from the MMF 108. The TIR reflection mirror portion 104 is used to couple light from the waveguide vertically to a high-speed germanium (Ge) detector 116 grown on top of silicon. The fabrication technique of such a Ge PD 116 is well established. Because the light from the tapered waveguide incident into the Ge PD can be reflected from the metal contact on top of the Ge layer in the detector, double optical path is achieved in the Ge active region. This leads to higher quantum efficiency with a thinner Ge film for higher speed. The estimated speed of the detector with a Ge thickness of ~1.5 um is >20 GHz, good for 25 Gb/s applications.

Figure 2:
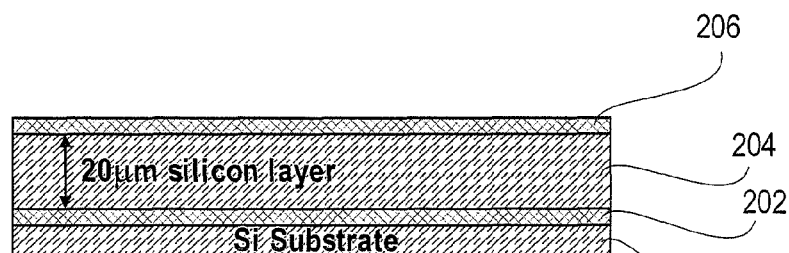
FIG. 2 is a view of the silicon on insulator (SOI) substrate for forming the optical receiver shown in FIG. 1.

FIGS. 2-7 illustrate the fabrication steps of the proposed integrated silicon receiver chip according to one embodiment. Referring now to FIG. 2, a silicon on insulator (SOI) wafer comprises a silicon substrate a buried oxide (BOX) layer 202 and a silicon handle layer 204 on the BOX layer 202. In one embodiment, the Si layer 204 may be approximately 20-30 um thick. This thickness of course may differ for differing applications. A sacrificial oxide hard mask (HM) layer 206 may be on top of the Si layer 204.

Figure 3:
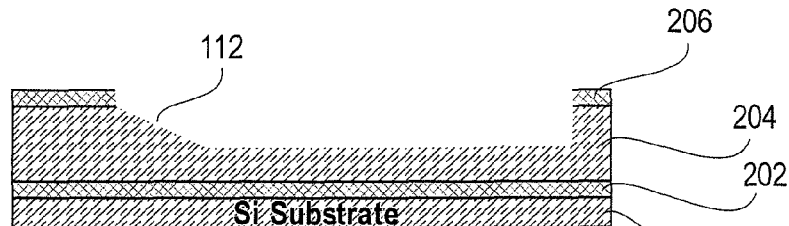
FIG. 3 is a side view of the SOI wafer illustrating etching of the taper.
Figure 4:
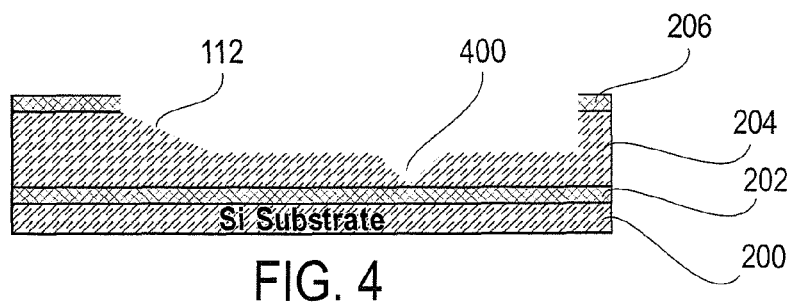
FIG. 4 is a side view of SOI wafer illustrating etching of the V-groove for the mirror.

In FIG. 3, the taper portion of the waveguide from FIG. 1 is etched through the HM layer 206 and partway through the Si layer 204 to an etch depth of approximately 10 um. The etched portion may be generally rectangular at one end and tapered at the other. In FIG. 4, a V-groove 400 may be further etched from the Si layer 204 for later forming of the wedge mirror 114 shown in FIG. 1. The V-groove 400 may be etched, for example, with a Potassium Hydroxide (KOH) wet etch technique. The V-groove 400 etch may in some embodiments reach the buried oxide (BOX) 202 or leaves a thin silicon layer (0.5-1 um) for Ge growth later.

Figure 5:
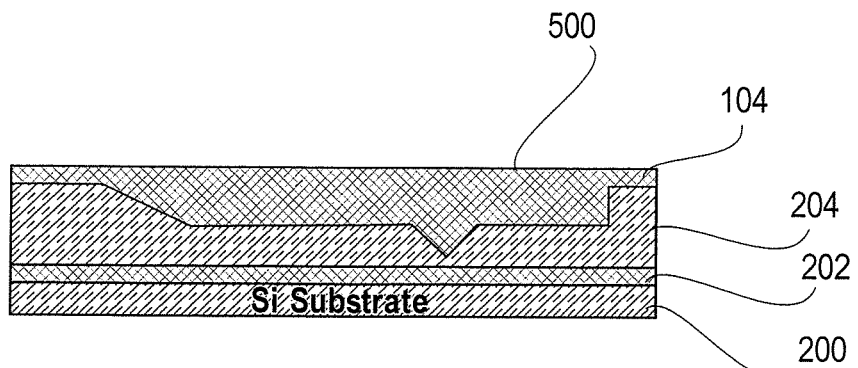
FIG. 5 is a side view of the SOI wafer illustrating deposition of an odile layer for the total internal reflection mirror.

In FIG. 5, the etched trenches are filled with oxide 500 followed by chemical mechanical planarization (CMP). The oxide comprises the total internal reflection (TIR) mirror shown in FIG. 1.

Figure 6:
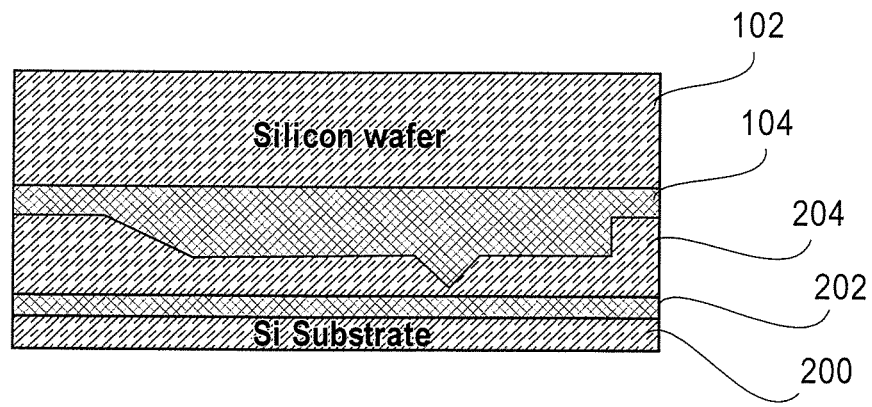
FIG. 6 is a side view of the SOI wafer having a silicon wafer bonded on top.
Figure 7:
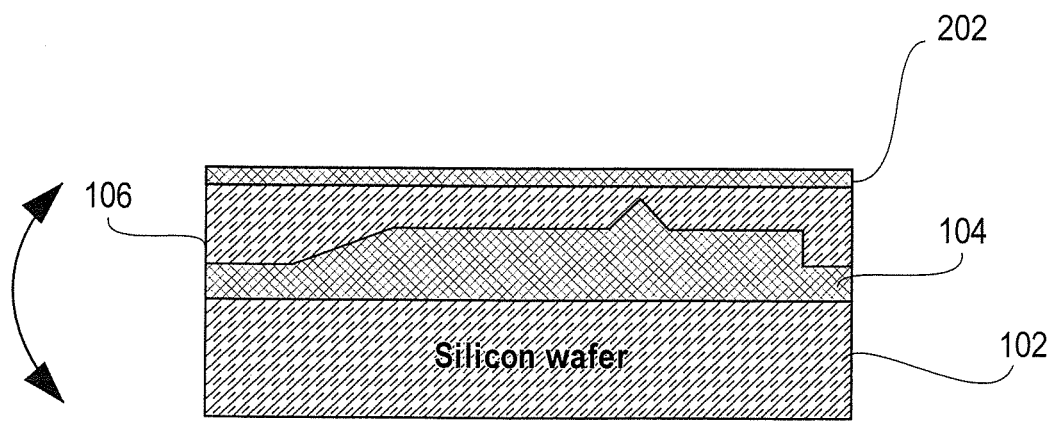
FIG. 7 is a side view of the SOI shown in FIG. 6 flipped over for further silicon photonic processing of the photo-detector (PD) and optional grating as shown in FIG. 1.

In FIG. 6 the planarized wafer will be wafer-bonded with a separate silicon wafer 102. After the wafer bonding, the original handle wafer 200 of the SOI wafer will be removed. As shown in FIG. 7, the entire apparatus may be flipped over. Removal of the handle wafer 200 creates a new wafer with BOX 202 as a hard mask. The hard mask (HM) BOX layer 202 may be used for further process of Echelle grating 118 and Ge photo-detector (PD) as shown in FIG. 1, the processing techniques of which are well known in the art.

Figure 8:
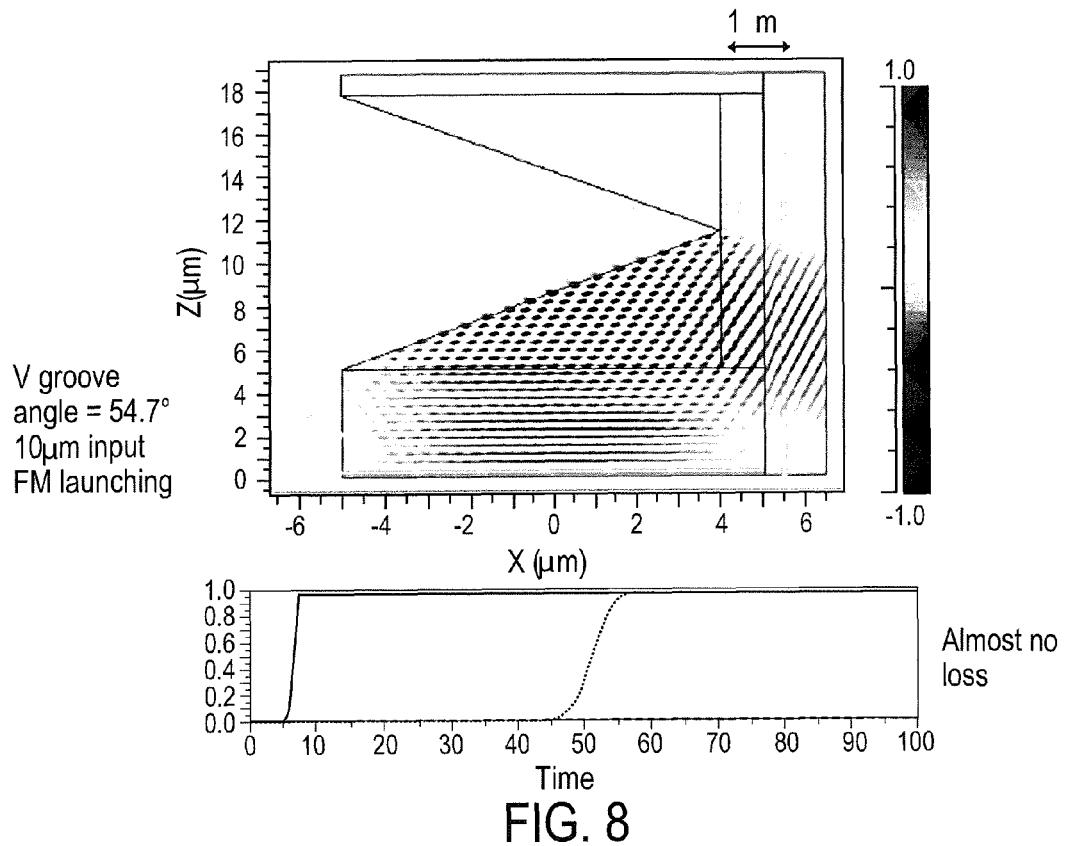
FIG. 8 is a graph illustrating modeling optical loss for the V-groove mirror structure of the integrated optical receiver under single mode conditions.
Figure 9:
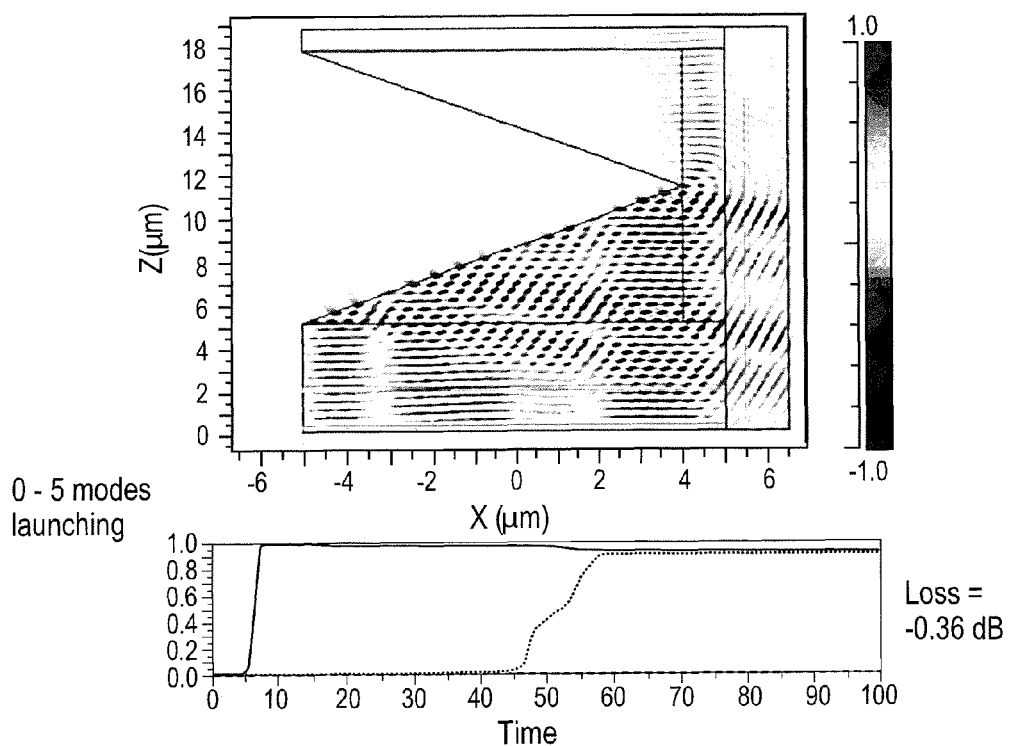
FIG. 9 is a graph illustrating modeling optical loss for the V-groove mirror structure of the integrated optical receiver under multi-mode conditions.

Referring now to FIGS. 8 and 9, the optical loss of the V groove mirror structure is modeled under single mode and multi mode launching conditions, respectively. With a V-groove angle of 54.7°, the single mode case of FIG. 8 shows that there is almost no optical loss. As shown in FIG. 9, for the multi-mode case with 0-5 modes launching there is low at only −0.36 dB. It is also noted that even with a silicon layer of 1 um un-etched for the V groove mirror, optical loss is still small. Namely, most of the light is reflected at the mirror facet and directed to the PD 116.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An integrated optical receiver system, comprising:
    a silicon substrate;
    a mirror structure disposed on the silicon substrate;
    a silicon waveguide disposed on the silicon substrate and optically coupled to the minor structure, the silicon waveguide having a wide input end that tapers to a narrower end, the input end to receive light from an optical fiber;
    a grating structure optically coupled to the silicon waveguide and proximate to the minor structure, wherein the grating structure includes an etched grating de-multiplexer formed in the silicon waveguide to facilitate de-multiplexing of single-mode beams and multi-mode beams, wherein the grating structure further includes etched trenches having a buried oxide layer filled with oxide comprising a total internal reflection (TIR) minor of the mirror structure; and
    a photodetector proximate to a portion of the narrower end of the silicon waveguide wherein light entering the silicon waveguide from the optical fiber is capable of being propagated in a first direction along a length of the silicon waveguide and in a second direction different from the first direction to the photodetector and the change in direction of propagation occurs proximate to the minor structure.

2. The system of claim 1, wherein the photodetector comprises a germanium photodetector, wherein the grating structure further comprises a planarized wafer being wafer-bonded with a silicon wafer such that upon flipping, the silicon water switches to an opposite end and wherein an original handle wafer of the silicon substrate is removed.

3. The system of claim 1, wherein the substrate comprises a silicon-on-insulator substrate.

4. The system of claim 1, wherein the buried oxide layer is placed between the silicon substrate and the silicon waveguide.

5. The system of claim 1, wherein the etched grating de-multiplexer is formed in an etched region of the silicon waveguide in front of a V-groove wedge.

6. An integrated optical receiver system, comprising:
   a silicon substrate;
   a mirror structure disposed on the silicon substrate;
   a silicon waveguide disposed on the silicon substrate and optically coupled to the minor structure, the silicon waveguide having an wide input end that tapers to a narrower end, the input end to receive light from an optical fiber;
   an optical fiber optically coupled to the input end of the silicon waveguide;
   a grating structure optically coupled to the silicon waveguide and proximate to the minor structure, wherein the grating structure includes an etched grating de-multiplexer formed in the silicon waveguide to facilitate de-multiplexing of single-mode beams and multi-mode beams, wherein the grating structure further includes etched trenches having a buried oxide layer filled with oxide comprising a total internal reflection (TIR) minor of the mirror structure; and
   a photodetector proximate to a portion of a narrower end of the silicon waveguide, wherein light entering the silicon waveguide from the optical fiber is capable of being propagated in a first direction along a length of the silicon waveguide and in a second direction different from the first direction to the photodetector and the change in direction of propagation occurs proximate to the minor structure.

7. The system of claim 6, wherein the optical fiber is a multi-mode optical fiber.

8. The system of claim 6, wherein the photodetector is a germanium photodetector, wherein the grating structure further comprises a planarized wafer being wafer-bonded with a silicon wafer such that upon flipping, the silicon water switches to an opposite end and wherein an original handle wafer of the silicon substrate is removed.

9. The system of claim 6, wherein the substrate is a silicon-on-insulator substrate.

10. The system of claim 6, wherein the buried oxide layer is placed between the silicon substrate and the silicon waveguide.

11. The system of claim 6, wherein the etched grating de-multiplexer is formed in an etched region of the silicon waveguide in front of a V-groove wedge.

12. An apparatus comprising:
   a silicon substrate;
   a mirror structure disposed on the silicon substrate;
   a silicon waveguide disposed on the silicon substrate and optically coupled to the minor structure, the silicon waveguide having a wide input end that tapers to a narrower end, the input end to receive light from an optical fiber;
   a grating structure optically coupled to the silicon waveguide and proximate to the minor structure, wherein the grating structure includes an etched grating de-multiplexer formed in the silicon waveguide to facilitate de-multiplexing of single-mode beams and multi-mode beams, wherein the grating structure further includes etched trenches having a buried oxide layer filled with oxide comprising a total internal reflection (TIR) minor of the mirror structure; and
   a photodetector proximate to a portion of the narrower end of the silicon waveguide wherein light entering the silicon waveguide from the optical fiber is capable of being propagated in a first direction along a length of the silicon waveguide and in a second direction different from the first direction to the photodetector and the change in direction of propagation occurs proximate to the minor structure.

13. The apparatus of claim 12, wherein the photodetector comprises a germanium photodetector, wherein the substrate comprises a silicon-on-insulator substrate, wherein the grating structure further comprises a planarized wafer being wafer-bonded with a silicon wafer such that upon flipping, the silicon water switches to an opposite end and wherein an original handle wafer of the silicon substrate is removed.

14. The apparatus of claim 12, wherein the buried oxide layer is placed between the silicon substrate and the silicon waveguide, wherein the etched grating de-multiplexer is formed in an etched region of the silicon waveguide in front of a V-groove wedge.

15. The apparatus of claim 12, wherein the optical fiber comprises a multi-mode optical fiber, wherein a lens is placed between the multi-mode fiber and the silicon waveguide input end.

16. An apparatus comprising:
   a silicon substrate;
   a mirror structure disposed on the silicon substrate;
   a silicon waveguide disposed on the silicon substrate and optically coupled to the minor structure, the silicon waveguide having an wide input end that tapers to a narrower end, the input end to receive light from an optical fiber;
   an optical fiber optically coupled to the input end of the silicon waveguide;
   a grating structure optically coupled to the silicon waveguide and proximate to the minor structure, wherein the grating structure includes an etched grating de-multiplexer formed in the silicon waveguide to facilitate de-multiplexing of single-mode beams and multi-mode beams, wherein the grating structure further includes etched trenches having a buried oxide layer filled with oxide comprising a total internal reflection (TIR) minor of the mirror structure; and
   a photodetector proximate to a portion of a narrower end of the silicon waveguide, wherein light entering the silicon waveguide from the optical fiber is capable of being propagated in a first direction along a length of the silicon waveguide and in a second direction different from the first direction to the photodetector and the change in direction of propagation occurs proximate to the minor structure.

17. The apparatus of claim 16, wherein the optical fiber is a multi-mode optical fiber, wherein the photodetector is a germanium photodetector, wherein the grating structure further comprises a planarized wafer being wafer-bonded with a silicon wafer such that upon flipping, the silicon water switches to an opposite end and wherein an original handle wafer of the silicon substrate is removed.

18. The apparatus of claim 16, further comprising: a lens between the multi-mode fiber and the silicon waveguide input end, wherein the substrate is a silicon-on-insulator substrate.

19. The apparatus of claim 16, wherein the buried oxide layer is placed between the silicon substrate and the silicon waveguide, wherein the etched grating de-multiplexer is formed in an etched region of the silicon waveguide in front of a V-groove wedge.

* * * * *

UNITED STATES PATENT AND TRADEMARK OFFICE
CERTIFICATE OF CORRECTION

Page 1 of 1

| | |
|---|---|
| PATENT NO. | : 9,076,902 B2 |
| APPLICATION NO. | : 13/686706 |
| DATED | : July 7, 2015 |
| INVENTOR(S) | : Liu |

It is certified that error appears in the above-identified patent and that said Letters Patent is hereby corrected as shown below:

In the Specification

Please insert in column 1, line 5 before BACKGROUND:

--STATEMENT OF GOVERNMENT INTEREST

This invention was made with Government support under contract number H98230-08-3-0011 awarded by the Department of Defense. The Government has certain rights in this invention.--

Signed and Sealed this
First Day of December, 2015

Michelle K. Lee
*Director of the United States Patent and Trademark Office*